US009263477B1

(12) United States Patent  (10) Patent No.: US 9,263,477 B1
Du  (45) Date of Patent: Feb. 16, 2016

(54) TRI-GATE DISPLAY PANEL

(71) Applicant: SHENZHEN CHINA STAR OPTOELECTRONICS TECHNOLOGY CO., LTD., Shenzhen (CN)

(72) Inventor: Peng Du, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/416,456

(22) PCT Filed: Dec. 15, 2014

(86) PCT No.: PCT/CN2014/093887
§ 371 (c)(1),
(2) Date: Jul. 1, 2015

(30) Foreign Application Priority Data

Oct. 20, 2014   (CN) .......................... 2014 1 0559614

(51) Int. Cl.
*H01L 27/12* (2006.01)
*H01L 33/38* (2010.01)

(52) U.S. Cl.
CPC .......... *H01L 27/124* (2013.01); *H01L 27/1214* (2013.01); *H01L 27/1255* (2013.01); *H01L 33/38* (2013.01)

(58) Field of Classification Search
CPC .............. H01L 27/124; H01L 27/1214; H01L 27/1255; H01L 33/38
USPC .......................... 257/72, 88, 89; 349/139, 149
See application file for complete search history.

(56) References Cited

U.S. PATENT DOCUMENTS 5,353,138 A * 10/1994 Van Winsum ......... G02F 1/1365
                                                        349/109
5,668,613 A *  9/1997 Kim ................... G02F 1/136213
                                                         349/38

(Continued)

FOREIGN PATENT DOCUMENTS

| CN | 101271658 A | 9/2008 |
|----|-------------|--------|
| CN | 101414451 A | 4/2009 |
| CN | 103293809 A | 9/2013 |
| CN | 103872077 A | 6/2014 |

OTHER PUBLICATIONS

International Search Report and Written Opinion (Forms PCT/ISA210 and PCT/ISA/237) issued on Jul. 23, 2015, by the State Intellectual Property Office of China, in corresponding International Application No. PCT/CN2014/093887. (9 pages).

*Primary Examiner* — Matthew Landau
*Assistant Examiner* — Grant Withers
(74) *Attorney, Agent, or Firm* — Buchanan Ingersoll & Rooney PC

(57) ABSTRACT

A tri-gate display panel is provided, comprising: a plurality of pixel units each including three sub-pixel units for displaying different colors, wherein each sub-pixel unit is provided with a thin film transistor which has its source connected to a charge electrode of the sub-pixel unit via a capacitor of the sub-pixel unit per se; a plurality of gate lines which are successively arranged along a first direction of the display panel, so as to connect to gates of the thin film transistors of corresponding sub-pixel units; a plurality of data lines, which are successively arranged along a second direction of the display panel, so as to connect to drains of the thin film transistors of corresponding sub-pixel units; and a fanout area including a plurality of fanout lines, wherein output terminals of the plurality of fanout lines are arranged in accordance with the plurality of gate lines and are in pair-wise cross connections to the plurality of gate lines. According to the present disclosure, charging differences between different colors of sub-pixels can be reduced. Hence, color shifting of a blending picture at two sides of the panel can be avoided and display effects can be improved.

7 Claims, 5 Drawing Sheets

(56) References Cited

U.S. PATENT DOCUMENTS

| | | | | |
|---|---|---|---|---|
| 5,742,074 A * | 4/1998 | Takizawa | G02F 1/1345 | 257/59 |
| 6,104,465 A * | 8/2000 | Na | G02F 1/1345 | 349/152 |
| 6,140,990 A * | 10/2000 | Schlig | G09G 3/3659 | 345/92 |
| 6,842,200 B1 * | 1/2005 | Su | G02F 1/1345 | 349/139 |
| 7,102,718 B1 * | 9/2006 | Yamazaki | G02F 1/134363 | 257/E27.111 |
| 7,499,141 B2 * | 3/2009 | Lai | G02F 1/1345 | 257/59 |
| 7,538,828 B2 * | 5/2009 | Brody | G02F 1/1362 | 257/59 |
| 8,045,119 B2 * | 10/2011 | Huang | G02F 1/136204 | 324/760.02 |
| 8,284,368 B2 * | 10/2012 | Liao | G09G 3/3614 | 345/96 |
| 8,810,491 B2 * | 8/2014 | Wu | G09G 3/2025 | 345/212 |
| 8,854,561 B2 * | 10/2014 | Liao | G02F 1/136213 | 345/93 |
| 8,987,745 B2 | 3/2015 | Du et al. | | |
| 9,082,665 B2 * | 7/2015 | Du | H01L 27/124 | |
| 2003/0086048 A1 * | 5/2003 | Ukita | G02F 1/1345 | 349/149 |
| 2003/0227078 A1 * | 12/2003 | Chang | G02F 1/1345 | 257/693 |
| 2004/0178409 A1 * | 9/2004 | Hong | G02F 1/13624 | 257/59 |
| 2005/0012885 A1 * | 1/2005 | Park | G02F 1/136213 | 349/139 |
| 2005/0018121 A1 * | 1/2005 | Jen | G02F 1/1345 | 349/151 |
| 2005/0195338 A1 * | 9/2005 | Matsumoto | G02F 1/136204 | 349/40 |
| 2006/0097262 A1 * | 5/2006 | Kim | G02F 1/136213 | 257/72 |
| 2006/0154422 A1 * | 7/2006 | Chun | H01L 21/268 | 438/274 |
| 2007/0120152 A1 * | 5/2007 | Chang | G02F 1/133345 | 257/270 |
| 2007/0285370 A1 * | 12/2007 | Kim | G02F 1/1345 | 345/92 |
| 2008/0157364 A1 * | 7/2008 | Yang | G02F 1/1345 | 257/741 |
| 2008/0179593 A1 * | 7/2008 | Lim | H01L 27/12 | 257/59 |
| 2008/0203391 A1 * | 8/2008 | Kim | G02F 1/1345 | 257/59 |
| 2008/0239225 A1 * | 10/2008 | Chen | G02F 1/13394 | 349/139 |
| 2009/0066872 A1 * | 3/2009 | Hirato | G02F 1/133707 | 349/46 |
| 2009/0096975 A1 * | 4/2009 | Kwon | H01L 27/1259 | 349/139 |
| 2009/0102777 A1 * | 4/2009 | Izumikawa | G09G 3/3614 | 345/96 |
| 2009/0278123 A1 * | 11/2009 | Peng | H01L 27/124 | 257/48 |
| 2009/0294771 A1 * | 12/2009 | Kim | G02F 1/136204 | 257/59 |
| 2010/0020256 A1 * | 1/2010 | Lee | G02F 1/136209 | 349/39 |
| 2010/0025690 A1 * | 2/2010 | Kim | H01L 27/124 | 257/66 |
| 2010/0045920 A1 * | 2/2010 | Kwak | G02F 1/1339 | 349/153 |
| 2010/0059758 A1 * | 3/2010 | Liu | G02F 1/136286 | 257/72 |
| 2010/0155729 A1 * | 6/2010 | Yang | G02F 1/1345 | 257/52 |
| 2010/0245733 A1 * | 9/2010 | Ono | G02F 1/13394 | 349/106 |
| 2010/0289792 A1 * | 11/2010 | Liao | G09G 3/3614 | 345/213 |
| 2011/0089423 A1 * | 4/2011 | Kwon | H01L 23/544 | 257/59 |
| 2011/0096258 A1 * | 4/2011 | Shim | G02F 1/1333 | 349/39 |
| 2011/0109859 A1 * | 5/2011 | Ito | G02F 1/134363 | 349/139 |
| 2011/0227816 A1 * | 9/2011 | Nakamura | G02F 1/133707 | 345/92 |
| 2012/0050657 A1 * | 3/2012 | Lin | G02F 1/136286 | 349/139 |
| 2012/0104419 A1 * | 5/2012 | Liao | G02F 1/133351 | 257/88 |
| 2012/0268703 A1 * | 10/2012 | Funakoshi | G02F 1/134363 | 349/139 |
| 2013/0002975 A1 * | 1/2013 | Wen | G02F 1/1309 | 349/54 |
| 2013/0009661 A1 * | 1/2013 | Chen | G02F 1/1309 | 324/760.02 |
| 2013/0044094 A1 * | 2/2013 | Li | G09G 3/3406 | 345/211 |
| 2013/0076808 A1 * | 3/2013 | Zhang | G09G 3/3677 | 345/694 |
| 2013/0088679 A1 * | 4/2013 | Lu | G09G 3/006 | 349/139 |
| 2013/0135281 A1 * | 5/2013 | Hou | G09G 3/3648 | 345/212 |
| 2013/0292713 A1 * | 11/2013 | Wu | G02F 1/136259 | 257/88 |
| 2014/0009448 A1 * | 1/2014 | Chi | H01L 27/124 | 345/204 |
| 2014/0009708 A1 * | 1/2014 | Lee | G02F 1/136286 | 349/43 |
| 2014/0054624 A1 * | 2/2014 | Chen | H01L 27/156 | 257/89 |
| 2014/0078032 A1 * | 3/2014 | Xia | G09G 3/3648 | 345/92 |
| 2014/0091343 A1 * | 4/2014 | Nakano | G02F 1/133516 | 257/89 |
| 2014/0103345 A1 * | 4/2014 | Yang | H01L 27/124 | 257/57 |
| 2014/0104148 A1 * | 4/2014 | Wang | G09G 5/00 | 345/92 |
| 2014/0160695 A1 * | 6/2014 | Jeong | H05K 3/305 | 361/749 |
| 2014/0353668 A1 * | 12/2014 | Du | H01L 27/124 | 257/72 |
| 2014/0354616 A1 * | 12/2014 | Liao | G09G 3/3696 | 345/212 |
| 2014/0375344 A1 * | 12/2014 | Wang | G09G 3/006 | 324/750.3 |
| 2015/0002561 A1 * | 1/2015 | Yao | G02F 1/136213 | 345/694 |
| 2015/0015821 A1 * | 1/2015 | Lo | G02F 1/1368 | 349/43 |
| 2015/0138471 A1 * | 5/2015 | Dong | G02F 1/13306 | 349/43 |
| 2015/0173232 A1 * | 6/2015 | Chai | H05K 7/06 | 361/748 |
| 2015/0187797 A1 * | 7/2015 | Xu | H01L 21/28008 | 257/347 |
| 2015/0255487 A1 * | 9/2015 | Yoshida | G02F 1/1345 | 257/43 |
| 2015/0261057 A1 * | 9/2015 | Harris | G02F 1/167 | 359/271 |
| 2015/0286084 A1 * | 10/2015 | Yoshida | G02F 1/1345 | 257/43 |
| 2015/0294611 A1 * | 10/2015 | Zheng | G09G 3/2003 | 345/694 |
| 2015/0294632 A1 * | 10/2015 | Chen | G02F 1/134336 | 345/215 |
| 2015/0295575 A1 * | 10/2015 | Lee | H03K 17/693 | 327/416 |

* cited by examiner

Middle of the panel

Two sides of the panel

TRI-GATE DISPLAY PANEL

CROSS-REFERENCE TO RELATED APPLICATIONS

The present application claims benefit of Chinese patent application CN 201410559614.3, entitled "Tri-gate display panel" and filed on Oct. 20, 2014, the entirety of which is incorporated herein by reference.

FIELD OF THE INVENTION

The present disclosure relates to the technical field of displays, and in particular to a tri-gate display panel.

BACKGROUND OF THE INVENTION

In designing a conventional tri-gate panel, the design of a high pin count is commonly adopted at a source side in order to save costs. For example, only one set of fanout terminals and one integrated circuit (IC) chip can be used at the source side. However, a fanout area thus designed generally has a large resistance difference (Rmax−Rmin) therein.

In practice, the major problem caused by a large impedance difference in the fanout area at the source side is color shifting at two sides of the panel during display of a blending picture. With respect to display of a blending picture, a data line would continuously charge two sub-pixels of a pixel before charging two sub-pixels of a next pixel. Since large impedance in the fanout area would cause rather sever RC delay of a signal, the charging condition of a first sub-pixel would be worse than that of a second sub-pixel. Especially for the fanout area having the largest wiring impedance, i.e., two sides of the panel, charging differences between sub-pixels would lead to color shifting.

As a result, a tri-gate display panel needs to be designed, in which, color shifting can be eliminated or would not be generated in displaying a blending picture.

SUMMARY OF THE INVENTION

In order to solve the above technical problems, the present disclosure provides a tri-gate display panel, in which, the color shifting phenomenon can be eliminated or would not be generated in displaying a blending picture. The panel comprises: a plurality of pixel units each including three sub-pixel units for displaying different colors, wherein each sub-pixel unit is provided with a thin film transistor, with its source connected to a charge electrode of the sub-pixel unit via a capacitor of the sub-pixel unit; a plurality of gate lines G1, G2, . . . , G(2n−1), G2n, which are successively arranged along a first direction of the display panel, so as to connect to gates of the thin film transistors of corresponding sub-pixel units; a plurality of data lines, which are successively arranged along a second direction of the display panel, so as to connect to drains of the thin film transistors of corresponding sub-pixel units; and a fanout area including a plurality of fanout lines, wherein output terminals of the plurality of fanout lines are arranged in accordance with the plurality of gate lines and are in pair-wise cross connections to the plurality of gate lines, such that when a high level pulse is applied to the fanout lines successively, the gate lines will be enabled in a sequence of G2, G1, . . . , G2n, G(2n−1).

According to one embodiment of the present disclosure, the three sub-pixel units are used for displaying the colors red, yellow, and blue, respectively.

According to one embodiment of the present disclosure, the sub-pixel units in two adjacent columns of pixel units are arranged in the same order of colors.

According to one embodiment of the present disclosure, each of the plurality of data lines is connected to drains of the thin film transistors of corresponding sub-pixel units located at one side of the data line.

According to one embodiment of the present disclosure, each of the plurality of data lines is connected to drains of the thin film transistors of corresponding sub-pixel units for displaying different colors located at both sides of the data line.

According to one embodiment of the present disclosure, the sub-pixel units in two adjacent columns of pixel units are arranged in opposite orders of colors.

According to one embodiment of the present disclosure, the data lines each charge four sub-pixel units simultaneously under the control of pulses of four corresponding gate lines.

In the present disclosure, the wiring mode on the panel has been changed, and the data lines, during operation, each charge four sub-pixels simultaneously. Thus, only half of the sub-pixel units are differently charged, thereby reducing charging differences between sub-pixels representing different colors. As a result, color shifting in a blending picture can be relieved, thus improving display quality of tri-gate display panels. When the sub-pixel units in two adjacent columns of pixel units are arranged in opposite orders of colors, charging differences between sub-pixel units representing different colors can be further attenuated under the same pulse sequence, thereby reducing overall color shifting.

In addition, with the wiring design of the present disclosure, the source fanout area can be designed with less restricted impedance, which renders it possible to compress the height of the fanout terminal in a larger extent, thereby facilitating design of panels with narrow frames.

Other features and advantages of the present disclosure will be further explained in the following description, and partly become self-evident therefrom, or be understood through implementing the present disclosure. The objectives and advantages of the present disclosure will be achieved through the structure specifically pointed out in the description, claims, and the accompanying drawings.

BRIEF DESCRIPTION OF THE DRAWINGS

The accompanying drawings are provided for further understanding of the present disclosure, and constitute one part of the description. They serve to explain the present disclosure in conjunction with the embodiments, rather than to limit the present disclosure in any manner. In the drawings.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It is important to note that as long as there is no conflict, all the technical features mentioned in all the embodiments may be combined together in any manner, and the technical solutions obtained in this manner all fall within the scope of the present disclosure.

Figure 1:
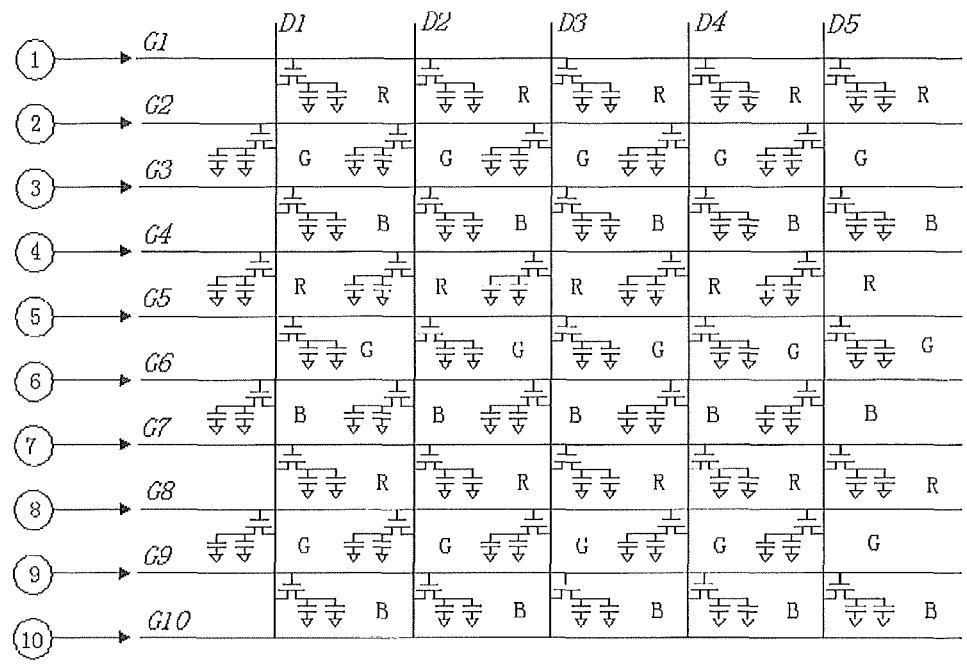
FIG. 1 shows a wiring diagram of fanout terminals and pixel units of a conventional tri-gate display panel.

FIG. 1 shows a wiring diagram of fanout terminals and pixel units of a conventional tri-gate display panel which adopts the design of a high pin count at a source side. In the figure, D1 to D5 represent data lines, while G1 to G10 represent gate lines. The circled numbers indicate serial numbers of fanout lines.

Figure 2:
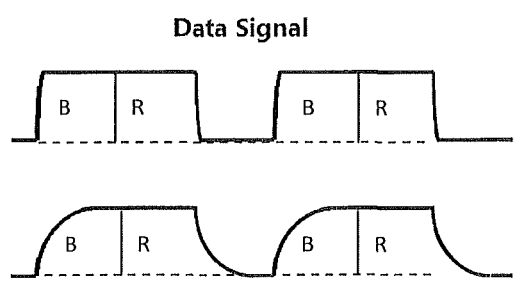
FIG. 2 shows charging conditions of pixels located in a middle area and two side areas of a conventional tri-gate display panel in displaying the color purple.

FIG. 2 shows charging conditions of pixels in displaying a blending picture of red and blue on the tri-gate display panel corresponding to FIG. 1. Gate lines (or scan lines) are successively enabled from the top down. Due to a significant difference of impedances between a middle area of the display panel and source fanout terminals at two sides of the display panel, the conditions of RC delay of signals for the data lines are also different from each other. The phenomenon of RC delay of signals for data lines at two sides of the display panel would be severer, as shown in the waveforms of FIG. 2. During operation of red and blue sub-pixels, the data lines charge the blue sub-pixels first and then the red sub-pixels. Due to significant delay of signal waveforms at two sides of the panel, compared with a place in the middle of the panel, the blue sub-pixels at two sides of the panel are all more poorly charged than the red sub-pixels. As a result, a purple picture displayed would finally be reddish at two sides of the panel, while an opposite scan direction would render the purple picture bluish at two sides of the panel. Similar problems would arise in displaying blue or aqua blue pictures.

Figure 3:
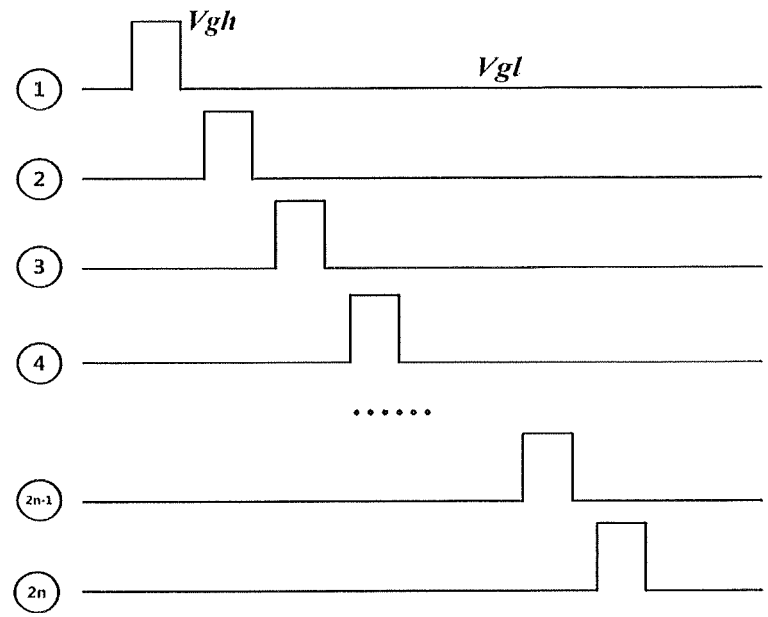
FIG. 3 shows a timing sequence diagram of scan pulses provided to fanout terminals of a tri-gate display panel.

FIG. 3 shows a sequence diagram of scan pulses provided to fanout terminals of a tri-gate display panel. According to the conventional wiring mode as shown in FIG. 1, the fanout terminals each connect to a corresponding gate line. Hence, the timing sequence of the scan pulses with respect to the fanout terminals is consistent with that for the gate lines. In this figure, Vgh represents a high level voltage, and when the signal of a gate line indicates a high level voltage, TFTs connected thereto will be turned on, followed by charging of corresponding pixels; and Vgl represents a low level voltage, and when the signal of the gate line indicates a low level voltage, TFTs connected thereto will be turned off. From the circled numbers, it can be conceived that the wiring relations between the fanout area and the gate lines as shown in FIG. 1 would enable the gate lines in the panel successively in a sequence of 1, 2, 3, . . . , 2n−1, 2n. Consequently, inconsistent charging periods as shown in FIG. 2 would arise, which would further lead to the problem of color shifting.

Figure 4:
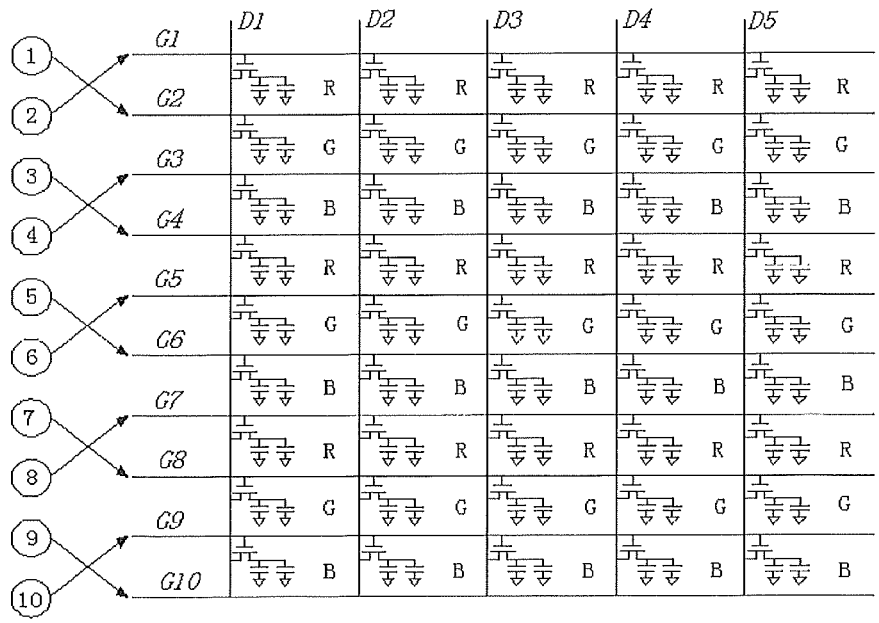
FIG. 4 schematically shows cross connections between fanout terminals and gate lines of pixels according to one embodiment of the present disclosure.

In order to solve the above problems, the present disclosure provides a wiring mode for a display panel, as indicated in FIG. 4. FIG. 4 schematically shows cross connections between fanout terminals and gate lines of pixels according to one embodiment of the present disclosure.

In the circuit as shown in FIG. 4, the display panel comprises a plurality of pixel units each including three sub-pixel units for displaying different colors, wherein each sub-pixel unit is provided with a thin film transistor, with its source connected to a charge electrode of the sub-pixel unit via a capacitor of the sub-pixel unit; a plurality of gate lines G1, G2, . . . , G(2n−1), G2n, which are successively arranged along a first direction, e.g., line direction or horizontal direction, of the display panel, so as to connect to gates of the thin film transistors of corresponding sub-pixel units; a plurality of data lines D1, D2, . . . , Dm, which are successively arranged along a second direction, e.g., column direction or vertical direction, of the display panel, so as to connect to drains of the thin film transistors of corresponding sub-pixel units; and a fanout area including a plurality of fanout lines, wherein output terminals of the plurality of fanout lines are arranged in accordance with the plurality of gate lines and are in pair-wise cross connections to the plurality of gate lines, such that when a high level pulse is applied to the fanout lines successively, the gate lines will be pulsed on in a sequence of G2, G1, . . . , G2n, G(2n−1).

In one embodiment of the present disclosure, the three sub-pixel units are used for displaying the colors red, yellow, and blue, respectively. Of source, the present disclosure is not limited hereto, and the sub-pixel units can be combinations of other colors also.

Figure 6:
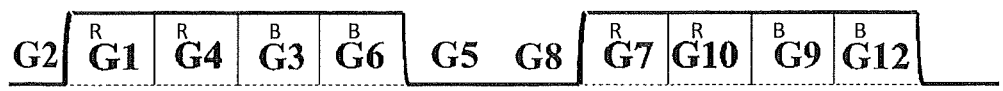
FIG. 6 shows a timing sequence diagram of charging four pixel electrodes at a time for displaying such as the color purple according to an embodiment of the present disclosure.
Figure 6:

In one embodiment of the present disclosure, each data line is connected to drains of the thin film transistors of corresponding sub-pixel units located at one side of the data line. Under the control of pulses of corresponding gate lines, the data lines each charge four sub-pixel units simultaneously. The charging waveforms are shown in FIG. 6.

Figure 8:
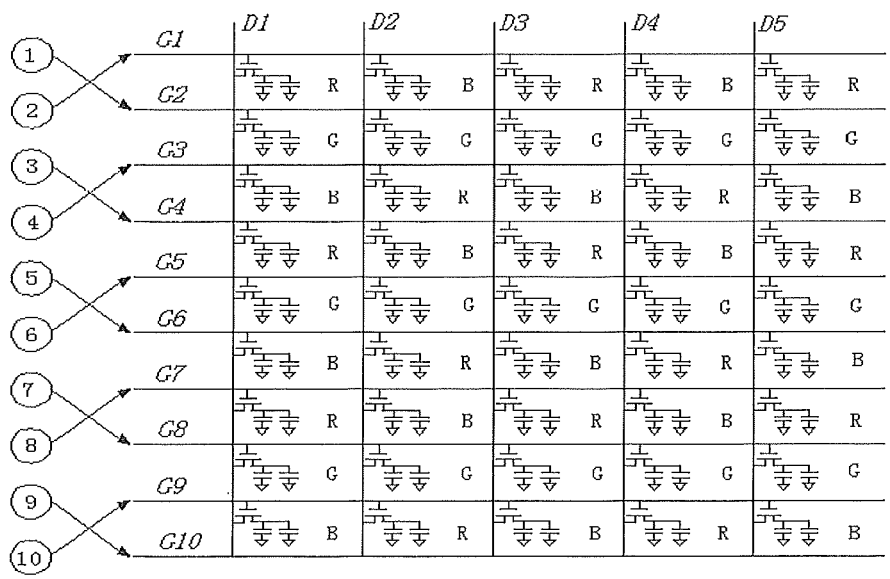
FIG. 8 shows a layout structure of a tri-gate panel according to a third embodiment of the present disclosure.
Figure 9:
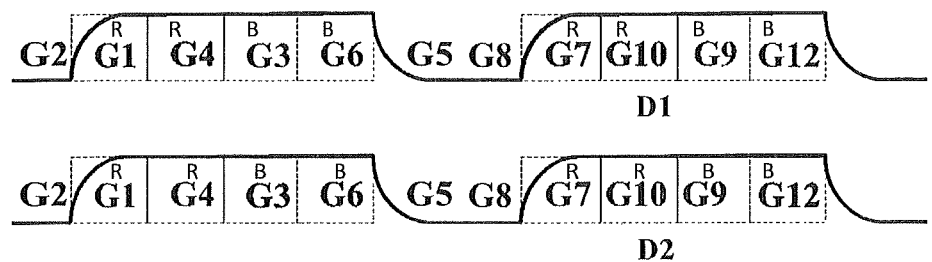
FIG. 9 shows charging conditions of data lines D1 and D2 respectively according to the present disclosure.

In the circuit of the panel layout as shown in FIG. 4, the sub-pixel units in two adjacent columns of pixel units are arranged in the same order of colors. Definitely, the sub-pixel units in two adjacent columns of pixel units can be arranged in opposite orders of colors also, as FIG. 8 shows. In FIG. 8, odd-numbered data lines each correspond to an RGB sequence (i.e., the sequence of red, green, and blue) of pixel colors, while even-numbered data lines each correspond to a BGR sequence (i.e., the sequence of blue, green, and red) of pixel colors. FIG. 9 shows charging conditions of data lines D1 and D2 as an example.

Under this wiring mode, the data lines each continuously charge four sub-pixel units at a time also. Reference will be made to display of a purple picture in a similar manner. When odd-numbered data lines are enabled for charging, first red sub-pixels would be poorly charged, while when even-numbered data lines are enabled for charging, first blue sub-pixels would be poorly charged. On the whole, charging differences between different colors of sub-pixels have disappeared, such that color shifting at two sides of the panel has been eliminated mostly as compared with the case under the conventional wiring mode.

In a conventional design as presented in FIG. 1, the wiring numbers in the fanout area and the numbers of gate lines in the panel are completely correspondent, in which a fanout line is connected to a same-numbered gate line. Hence, the fanout lines and the gate lines are both enabled in a sequence of 1, 2, 3, . . . , 2n−1, 2n. However, in the structure indicated in FIG. 4, such connection manner has been altered, so that wiring line 2n−1 in the fanout area is connected to gate line 2n in the panel, while wiring line 2n in the fanout area is connected to gate line 2n−1 in the panel. Wiring numbers in the fanout area are consistent with the conventional design as described above. However, due to variation of the connection manner, the gate lines in the panel will be enabled in different orders, with corresponding waveforms shown in FIG. 5.

In timing sequence, the gate lines within the panel are enabled in an order of 2, 1, 4, 3, . . . , 2$n$, 2$n$−1.

Figure 5:
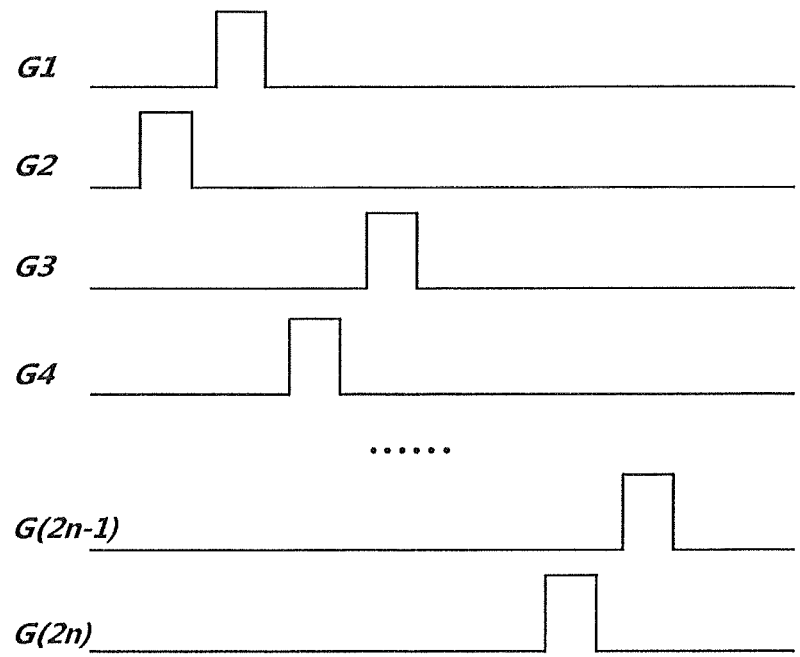
FIG. 5 shows a timing sequence diagram of pulses that occur on gate lines of the circuit as arranged in accordance with FIG. 4.

The colors of sub-pixels and waveforms of data lines corresponding to gate lines in FIG. 5 are each shown in FIG. 6. Under this wiring mode, data lines D1 to D5 each charge four sub-pixels at a time, thereby attenuating charging differences between different colors of sub-pixels. Similarly, reference will be made to display of a purple picture, whereby the gate lines are enabled successively from the top down. In this case, the waveforms of the data line signals in the middle and at two sides of the panel are shown in FIG. 6, with the data lines each charging four sub-pixels at a time. Due to severe RC delay at two sides of the panel, the first of the four sub-pixels will be poorly charged compared with the other three sub-pixels. However, on the whole, charging differences between the red and blue sub-pixels only occur to half of the sub-pixels at two sides of the panel, while the other half of the red and blue sub-pixels are equally charged. In a conventional tri-gate display panel design, however, all red sub-pixels at two sides of the panel will be differently charged from blue sub-pixels. Therefore, the wring mode according to the present disclosure can effectively eliminate charging differences between different colors of sub-pixels, thereby significantly relieving color shifting at two sides of the panel.

Figure 7:
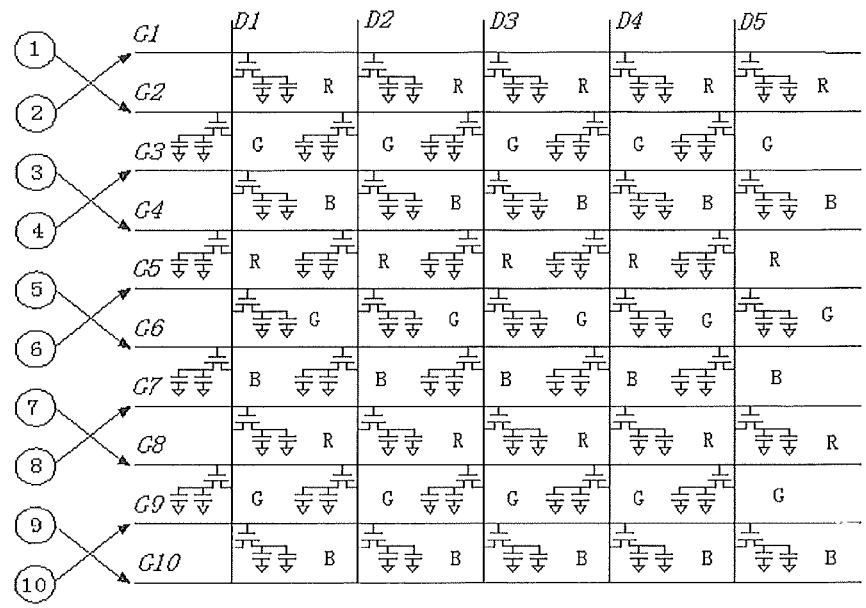
FIG. 7 shows a layout structure of a tri-gate panel according to a second embodiment of the present disclosure.

FIG. 7 shows a second embodiment of the present disclosure, in which each of the data lines is connected to drains of thin film transistors of different colors of sub-pixel units located at two sides of the data line, such that the sub-pixels located at two sides of the data line are alternately charged by the data line, thereby relieving color shifting at two sides of the panel. Compared with the wiring mode as shown in FIG. 4, the wiring mode shown in FIG. 7 can produce the same effects of relieved color shifting. However, with the wiring mode shown in FIG. 7, power consumption of single data lines can be reduced by charging a pixel unit with two data lines alternately, thereby prolonging service life of a display panel.

With the new wiring mode of a display panel, charging differences between different colors of sub-pixels can be reduced, thereby eliminating color shifting at two sides of a blending picture and improving display effects. In addition, the source fanout area can be designed with less restricted impedance, which facilitates achievement of design of narrow frames.

The above embodiments are described only for better understanding, rather than restricting, the present disclosure. Any person skilled in the art can make amendments to the implementing forms or details without departing from the spirit and scope of the present disclosure. The scope of the present disclosure should still be subject to the scope defined in the claims.

The invention claimed is:

1. A tri-gate display panel, comprising:
a plurality of pixel units, each including three sub-pixel units for displaying different colors, wherein each sub-pixel unit is provided with a thin film transistor, with its source directly connected to a charge electrode of a corresponding sub-pixel unit via a capacitor of the sub-pixel unit;
a plurality of gate lines G1, G2, . . . , G(2$n$−1), G2$n$, which are successively arranged along a first direction of the display panel, so as to connect to gates of the thin film transistors of corresponding sub-pixel units;
a plurality of data lines, which are successively arranged along a second direction of the display panel, so as to directly connect to drains of the thin film transistors of corresponding sub-pixel units; and
a fanout area including a plurality of fanout lines which are successively arranged along the first direction of the display panel, wherein output terminals of the plurality of fanout lines are arranged in accordance with the plurality of gate lines and are in pair-wise cross connections to the plurality of gate lines, such that when a high level pulse is applied to the fanout lines successively, the gate lines will be enabled in a sequence of G2, G1, G2$n$, G(2$n$−1).

2. The tri-gate display panel according to claim 1, wherein the three sub-pixel units are used for displaying the colors red, yellow, and blue, respectively.

3. The tri-gate display panel according to claim 2, wherein the sub-pixel units in two adjacent columns of pixel units are arranged in the same order of colors.

4. The tri-gate display panel according to claim 3, wherein each of the plurality of data lines is connected to drains of the thin film transistors of corresponding sub-pixel units for displaying different colors located at both sides of the data line.

5. The tri-gate display panel according to claim 2, wherein each of the plurality of data lines is connected to drains of the thin film transistors of corresponding sub-pixel units located at one side of the data line.

6. The tri-gate display panel according to claim 5, wherein the sub-pixel units in two adjacent columns of pixel units are arranged in opposite orders of colors.

7. The tri-gate display panel according to claim 1, wherein the data lines each charge four sub-pixel units simultaneously under the control of pulses of four corresponding gate lines.

* * * * *